(12) United States Patent
Ohashi et al.

(10) Patent No.: US 7,592,234 B2
(45) Date of Patent: Sep. 22, 2009

(54) METHOD FOR FORMING A NITROGEN-CONTAINING GATE INSULATING FILM

(75) Inventors: Takuo Ohashi, Tokyo (JP); Taishi Kubota, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/833,894

(22) Filed: Aug. 3, 2007

(65) Prior Publication Data

US 2008/0032509 A1    Feb. 7, 2008

(30) Foreign Application Priority Data

Aug. 7, 2006  (JP)  .............................. 2006-214402

(51) Int. Cl.
 *H01L 21/76* (2006.01)
(52) U.S. Cl. ................ 438/400; 257/E21.293
(58) Field of Classification Search ................ 438/400; 257/E21.267, E21.293
 See application file for complete search history.

(56) References Cited

U.S. PATENT DOCUMENTS

2005/0085092 A1*  4/2005  Adetutu et al. .............. 438/763

FOREIGN PATENT DOCUMENTS

| JP | 2002-203961 A | 7/2002 |
|---|---|---|
| JP | 2003-315174 A | 11/2003 |
| JP | 2006-008292 A | 1/2006 |
| JP | 2006-135229 A | 5/2006 |
| JP | 2006-156626 A | 6/2006 |
| JP | 2007-194239 A | 8/2007 |
| WO | 2004/034454 A1 | 4/2004 |

\* cited by examiner

*Primary Examiner*—W. David Coleman
(74) *Attorney, Agent, or Firm*—Sughrue Mion, PLLC

(57) ABSTRACT

A method for forming a nitrogen-containing gate insulating film includes the steps of forming a silicon oxide film on a silicon substrate, nitriding the top portion of the silicon oxide film to form a thin silicon nitride layer, and forming a silicon nitride film on the silicon nitride layer by using an atomic layer deposition process, to obtain a gate insulating film having a higher nitrogen concentration, while suppressing the nitrogen concentration in the vicinity of the gate insulating film and the silicon substrate.

13 Claims, 8 Drawing Sheets

METHOD FOR FORMING A NITROGEN-CONTAINING GATE INSULATING FILM

This application is based upon and claims the benefit of priority from Japanese patent application No. 2006-214402, the disclosure of which is incorporated herein in its entirety by reference.

BACKGROUND OF THE INVENTION (a) Field of the Invention

The present invention relates to a method for forming a gate insulating film in a semiconductor device and, more particularly, to the technique for forming a nitrogen-containing gate insulating film on a semiconductor substrate in the semiconductor device.

(b) Description of the Related Art

Along with wide spreading of mobile terminals, it is desired to further reduce the power dissipation in semiconductor devices such as a DRAM (Dynamic Random Access Memory) device. For achieving the lower power dissipation in the semiconductor devices, a technique for introducing nitrogen into the gate insulating film (gate oxide film) of MOSFETs (Metal-Insulator-Semiconductor Field Effect Transistors) is employed to reduce the thickness of the gate insulating film. The nitrogen introduced into the gate insulating film raises the dielectric constant of the gate insulating film, and prevents impurities from penetrating through the gate insulating film, to thereby improve the characteristics of MOSFETs.

Upon introduction of nitrogen into the gate insulating film, it is desired to control diffusion of the introduced nitrogen toward the interface between the gate insulating film and the silicon substrate. This is because the nitrogen accumulated in the vicinity of the interface with the silicon substrate generates an impurity level, to cause degradation in a variety of characteristics of MOSFETs, such as shift or variation in the threshold voltage (Vth) and reduction in the mobility of careers. In order to prevent the accumulation of nitrogen in the vicinity of the interface with the silicon substrate, a two-layer gate insulating film is employed, wherein a silicon oxide ($SiO_2$) layer and an overlying silicon nitride (SiN) layer are formed on the silicon substrate by using a CVD (Chemical Vapor Deposition) technique.

The technique for forming the two-layer gate insulating film including $SiO_2$ and SiN layers is described in Patent Publication JP-2002-203961A, for example.

It may be considered to use an ALD (Atomic Layer Deposition) technique for forming the above silicon nitride layer in the two-layer gate insulating film to obtain an improved reliability thereof. In the ALD technique, the silicon nitride layer may be formed by the steps of depositing a monoatomic silicon layer, and nitriding the deposited monoatomic silicon layer to form a silicon nitride layer having a monoatomic-level thickness, and iterating the process for formation of the monoatomic-level silicon nitride layer to obtain a desired thickness of the silicon nitride film. The ALD technique generally provides a superior film quality to the resultant silicon nitride film.

However, in the ALD technique for forming the silicon nitride layer on the $SiO_2$ layer, the concentration of nitrogen in the silicon nitride layer is considerably reduced compared to the concentration of the stoichiometric composition of SiN layer, whereby a desired concentration of nitrogen is not achieved in the two-layer gate insulating film. It is desired to raise the nitrogen concentration in the silicon nitride layer in the vicinity of the interface between the gate insulating film and the gate electrode, for obtaining MOSFETs having desired characteristics.

SUMMARY OF THE INVENTION

It is an object of the present invention to provide a method for manufacturing a semiconductor device including a nitrogen-containing gate insulating film having a relatively higher nitrogen concentration, while suppressing the nitrogen concentration in the vicinity of the gate insulating film and the silicon substrate.

The present invention provides a method for forming a nitrogen-containing gate insulating film in a semiconductor device, including: forming a silicon oxide film on a semiconductor substrate; nitriding a top portion of the silicon oxide film to form a silicon nitride layer on the silicon oxide film; and forming a silicon nitride film on the silicon nitride layer by using the steps of depositing a first silicon layer on the silicon nitride layer and nitriding the first silicon layer.

The above and other objects, features and advantages of the present invention will be more apparent from the following description, referring to the accompanying drawings.

PREFERRED EMBODIMENT OF THE INVENTION

Figure 1:
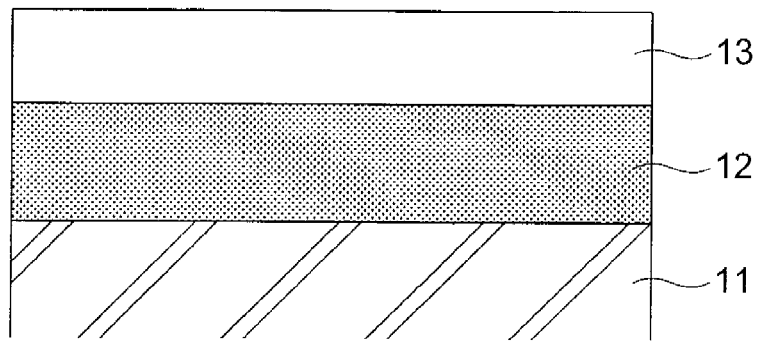
FIG. 1 is a sectional view manufactured by a process according to a first embodiment of the present invention.

Now, exemplary embodiments of the present invention will be described with reference to accompanying drawings, wherein similar constituent elements are designated by similar reference numerals throughout the drawings.

FIG. 1 is a sectional view showing a semiconductor device in a step of a process for manufacturing the semiconductor device according to a first exemplified embodiment of the present invention. The semiconductor device 10 includes a silicon substrate 11, a gate insulating film 12 formed on the silicon substrate 11, and a gate electrode 13 formed on the gate insulating film 12. The gate insulating film 12 includes silicon oxynitride having a nitrogen concentration profile which increases from the interface with the silicon substrate 11 toward the interface with the gate electrode 13. The gate electrode 13 is made of a polysilicon film doped with boron.

Figure 2:
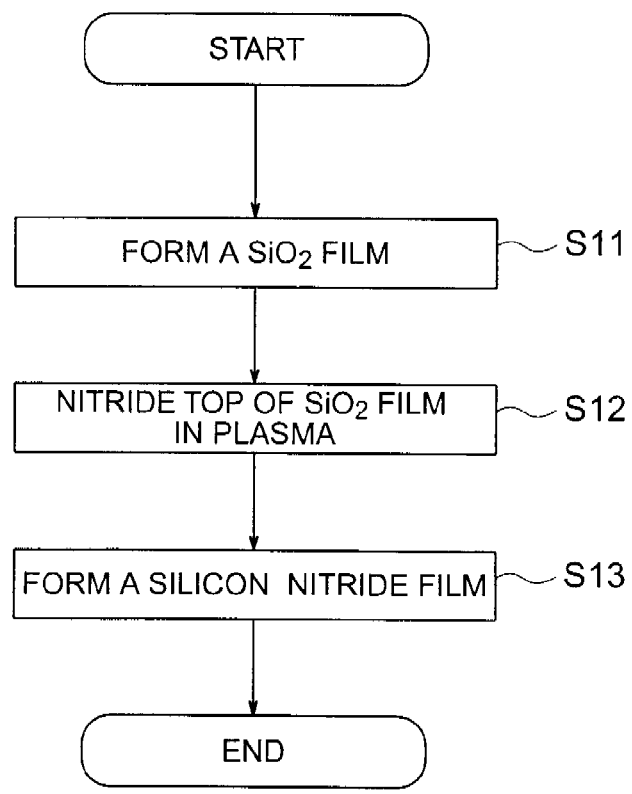
FIG. 2 is a flowchart showing the procedure of a process forming the gate insulating film shown in FIG. 1.
Figure 3A:
FIGS. 3A to 3C are sectional views of the semiconductor device, showing the steps S11 to S13, respectively, of FIG. 2.
Figure 3B:
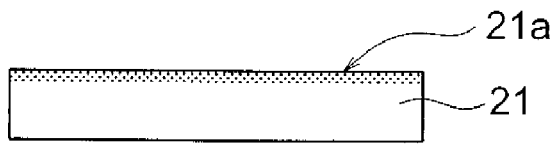
Figure 3C:
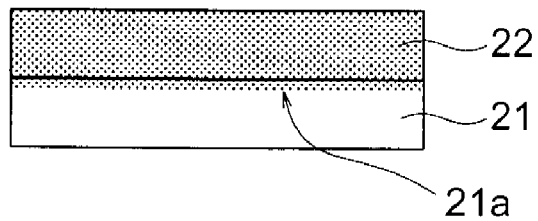

FIG. 2 is a flowchart showing the procedure of the process for forming the gate insulating film 12 shown in FIG. 1. FIGS. 3A to 3C are sectional views showing the steps S11 to S13, respectively, of FIG. 2. First, the surface of the silicon substrate 11 is subjected to cleaning. Subsequently, as shown in FIG. 3A, a $SiO_2$ film 21 is formed on the silicon substrate 11 by using an ALD technique (step S11). The formation of $SiO_2$ film is such that a monoatomic silicon layer is deposited on the silicon substrate 11, the deposited monoatomic silicon layer is oxidized by thermal oxidation to form a monoatomic-level-thick $SiO_2$ layer, and the process for forming the monoatomic-level-hick $SiO_2$ layer is iterated for several times or smaller number of times to obtain a desired thickness of the $SiO_2$ film 21.

The deposition of the monoatomic silicon layer uses dichlorosilane gas as a precursor, for example, which is thermally cracked at a substrate temperature of 450 to 500 degrees C. The substrate temperature employed herein saturates deposition of silicon onto the underlying film after 70 seconds elapsed from the start of deposition, to form a 0.2-nm-thick monoatomic silicon layer. After the 0.2-nm-thick silicon layer is formed, the same deposition condition does not provide an increase in the deposition thickness any more. The deposited silicon layer in step S11 is then subjected to oxidation at a substrate temperature of 450 to 500 degrees C., by exposure of the deposited monoatomic silicon layer to an oxygen environment for about 60 to 180 seconds. Deposition of the 0.2-nm-hick monoatomic silicon layer provides a $SiO_2$ film having a thickness of 0.4 nm.

Subsequently, an in-situ plasma-enhanced nitriding treatment is performed to the top portion of the $SiO_2$ film in the same deposition chamber, to form a thin silicon nitride layer 21a on the $SiO_2$ film 21 (step S12), as shown in FIG. 3B. The plasma-enhanced nitriding treatment uses $NH_3$ plasma. The plasma-enhanced nitriding treatment scarcely increases the thickness of the original $SiO_2$ film.

Subsequently, as shown in FIG. 3C, an ALD technique is used to form a silicon nitride film 22 on the thin silicon nitride layer 21a formed on the $SiO_2$ film 21 (step S13). The process for forming the silicon nitride film 22 is such that a monoatomic silicon layer is deposited, and then nitrided to form a monoatomic-level-thick silicon nitride layer. The process forming the silicon nitride layer may be iterated for several times or smaller number of times.

Deposition of the monoatomic silicon layer in step S13 is conducted under conditions similar to the conditions of step S11. Nitriding of the monoatomic silicon layer in step S13 is conducted using a plasma-enhanced nitriding treatment using $NH_3$ plasma, similarly to the step S12 of forming the thin silicon nitride layer 21a on the $SiO_2$ film 21. The nitriding treatment in step S13 is conducted at a substrate temperature of lower than 500 degrees C. for suppressing excessive diffusion of nitrogen.

In the process according to the present embodiment, plasma-enhanced nitriding treatment of the $SiO_2$ film to form thereon a thin silicon nitride layer prior to forming the desired thickness of the silicon nitride film allows the resultant silicon nitride film 22 to have a higher nitrogen concentration, which is similar to the nitrogen concentration corresponding to the stoichiometic composition of $Si_3N_4$.

In the present embodiment, although nitrogen is introduced from the surface of the $SiO_2$ film 21 during nitriding treatment of the top portion of the $SiO_2$ film 21 by using the plasma-enhanced nitriding process, the amount of nitriding on the top portion of $SiO_2$ is small, and thus the diffusion of nitrogen toward the interface with the silicon substrate 11 is effectively suppressed. The substrate temperature of lower than 500 degrees C. in the plasma-enhanced nitriding treatment for forming the silicon nitride layer also suppress the diffusion of nitrogen toward the interface.

As described above, the process of the present embodiment provides a gate insulating film having a higher nitrogen concentration in the vicinity of the interface with the gate electrode and a lower nitrogen concentration in the vicinity of the interface with the silicon substrate. This configuration of the gate insulating film provides superior characteristics to the MOSFETs.

Figure 15:
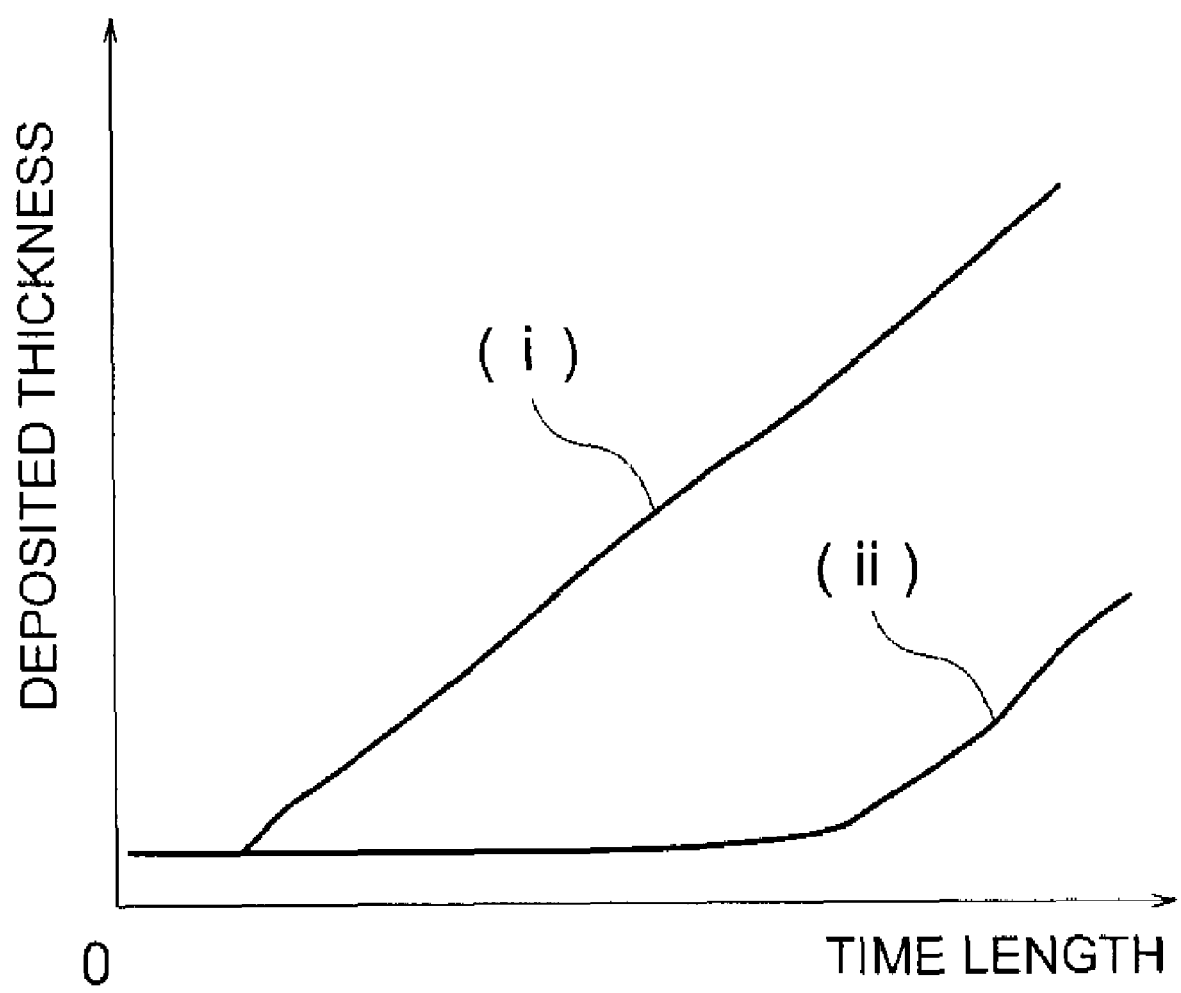
FIG. 15 is a graph showing the relationship between the thickness of the deposited SiN film and the deposition time length.

FIG. 15 shows the relationship between the thickness of the SiN film deposited on a $SiO_2$ film by using the ALD technique and the deposition time length, wherein graph (i) represents the deposition after nitriding of the top portion of the $SiO_2$ film and graph (ii) represents the deposition without nitriding of the top portion of the $SiO_2$ film. As understood from FIG. 15, nitriding of the $SiO_2$ film reduces the time length needed for the effective deposition to start since the start of the deposition process. More specifically, the nitriding of the surface of the $SiO_2$ film allows the SiN film to deposit thereon with ease in the ALD technique.

FIRST EXAMPLE

Figure 4:
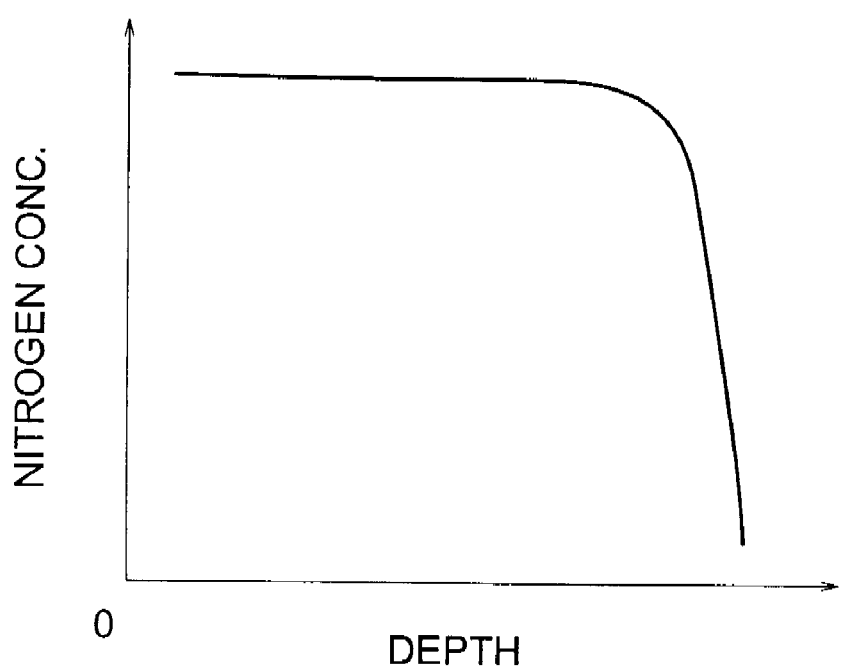
FIG. 4 is a graph showing the nitrogen concentration profile in the gate insulating film of the first example.

A semiconductor device of the first example was manufactured using a process according to the first exemplified embodiment. In the process, the deposition and oxidation of the monoatomic silicon layer in step S11 is iterated for five times to form the $SiO_2$ film, and the deposition and nitriding of the monoatomic silicon layer in step S13 was iterated for twenty times to form the silicon nitride film. FIG. 4 shows the nitrogen concentration profile with respect to the thickness direction in the resultant gate insulating film 12, wherein the leftmost end shows the interface with the gate electrode, and the rightmost end shows the interface with the silicon substrate.

As understood from FIG. 4, the larger number of iterated times (20 times in this example) for deposition and nitriding to form the silicon nitride film provided a larger thickness of the silicon nitride film 22 compared to the thickness of the $SiO_2$ film. As a consequence, the gate insulating film 12 had a higher dielectric constant without an increase in the nitrogen concentration in the vicinity of the interface with the silicon substrate, thereby reducing the power dissipation of the resultant MOSFETs compared to the conventional MOSFETs.

Figure 5:
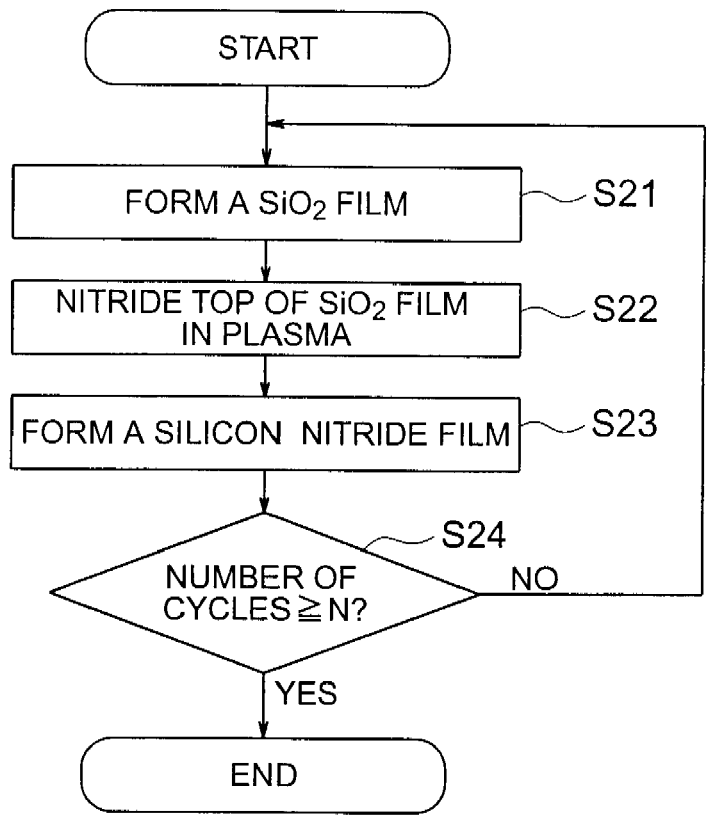
FIG. 5 is a flowchart showing the procedure of forming the gate insulating film in a process according to a second embodiment of the present invention.

FIG. 5 is a flowchart showing the procedure of a process according to a second exemplified embodiment of the present invention. In this process, the combination of steps S21 to S23 is iterated for a number (N) of times or cycles. In each of the step S21 or S23 iterated for the number (N) of times, the unit step of S11 or S13 including deposition and oxidizing or nitriding of the monoatomic silicon layer is iterated for a desired number of times. By controlling the ratio of the number of unit steps for forming the silicon nitride layer in step S23 to the number of unit steps for forming the silicon oxide layer in step S21, a desired nitrogen concentration profile with respect to the thickness direction can be obtained with a higher accuracy.

SECOND EXAMPLE

A semiconductor device of the second example was manufactured by a process according the second embodiment. The combination process including the steps S21 to S23 was iterated for five times or cycles (N=5). In the first cycle, step S21 included the unit step of S11 for five times, whereas the step S23 included the unit step of S13 for a single time. In each of the second to fourth cycles, the number of times for unit step in step S21 is less than by one than in step S21 in the previous cycle, whereby both the steps S21 and S23 in the fifth cycle included a single unit step of S11 and S23, respectively.

Figure 6:
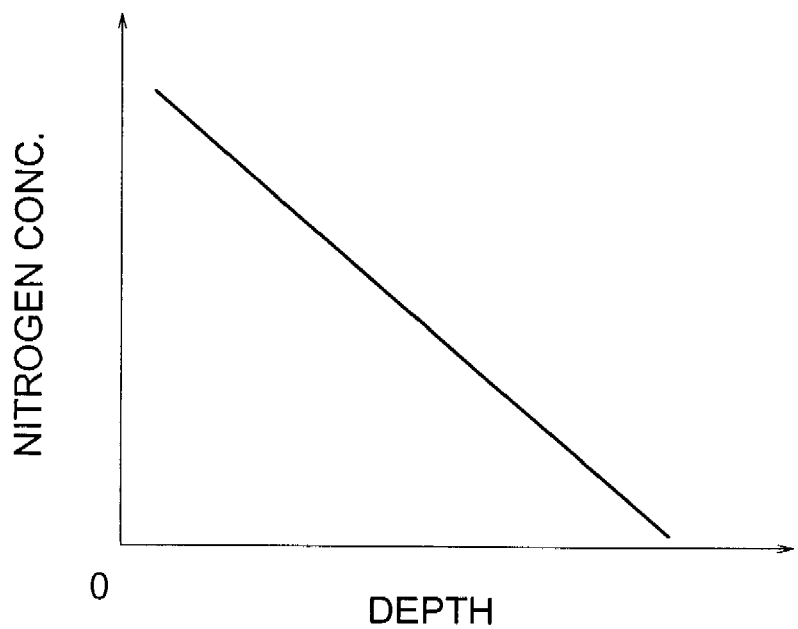
FIG. 6 is a graph showing the nitrogen concentration profile in the gate insulating film of the second example.

FIG. 6 shows, similarly to FIG. 4, the nitrogen concentration profile in the gate insulating film in the second example. As understood from FIG. 6, the nitrogen concentration profile in the gate insulating film 12 increases linearly with respect to the depth from the interface with the silicon substrate 11 toward the interface with the gate electrode 13. The average nitrogen concentration of the gate insulating film 12 was 25%, whereby it may be concluded that the semiconductor device of the second example had a higher average nitrogen concentration without an increase in the nitrogen concentration in the vicinity of the interface with the silicon substrate.

THIRD EXAMPLE

A semiconductor device of the third example was manufactured using a process according to the second embodiment. The process was such that the overall process included six cycles for the combination of steps S21 to S23. The steps S21 and S23 included five unit steps of S11 and a single unit step of S13, respectively, in the first cycle, included a single unit step of S11 and S13, respectively, in the second to fifth cycles, and included six unit steps of S11 and ten unit steps of S13, respectively, in the last sixth cycle.

Figure 7:
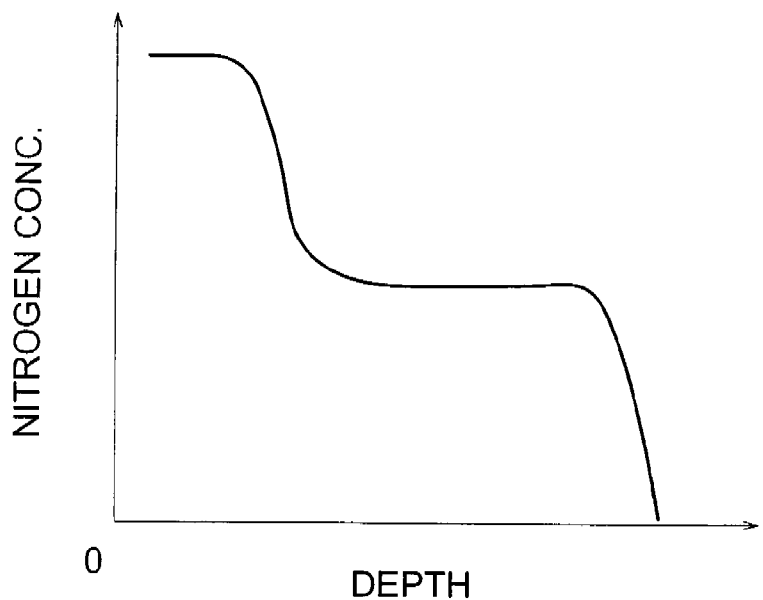
FIG. 7 is a graph showing the nitrogen concentration profile in the gate insulating film of the third example.

FIG. 7 shows, similarly to FIG. 4, the nitrogen concentration profile in the gate insulating film 12 of the third example. The stepwise increase of the number of unit steps of S13 in step S23 with respect to the number of unit steps of S11 in step S21 in the second cycle and the last cycle provided a stepwise increase in the nitrogen concentration in the vicinity of the interface with the silicon substrate as well as the interface with the gate electrode, as understood from FIG. 7. Although the average nitrogen concentration shown in FIGS. 6 and 7 is slightly lower than the average nitrogen concentration shown in FIG. 4, the second embodiment can effectively decrease the nitrogen concentration in the vicinity of the interface with the silicon substrate.

Figure 8:
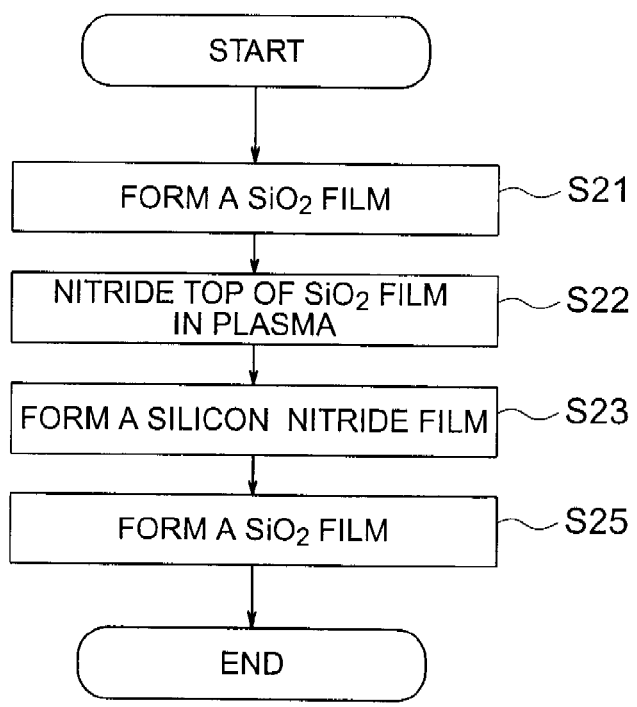
FIG. 8 is a flowchart showing the procedure of forming the gate insulating film in a process according to a third embodiment of the present invention.

FIG. 8 is a flowchart showing the procedure of a process for manufacturing a semiconductor device according to a third exemplified embodiment of the present invention. The process is such that the combination of the steps S11 to S13 is conducted for a single cycle or a plurality of cycles, followed by step S25 which includes a single unit step or a plurality of unit steps of S11 to form a SiO$_2$ film on the silicon nitride film formed in step S13.

It is to be noted here that the nitrogen existing in the vicinity of the interface with the gate electrode 13 may render the gate electrode 13 slightly depleted. In the process of the present embodiment, the final step S25 for forming the SiO$_2$ film on the silicon nitride film allows the nitrogen concentration in the vicinity of the gate electrode to be reduced, thereby suppressing the depletion of the gate electrode.

FOURTH EXAMPLE

Figure 9:
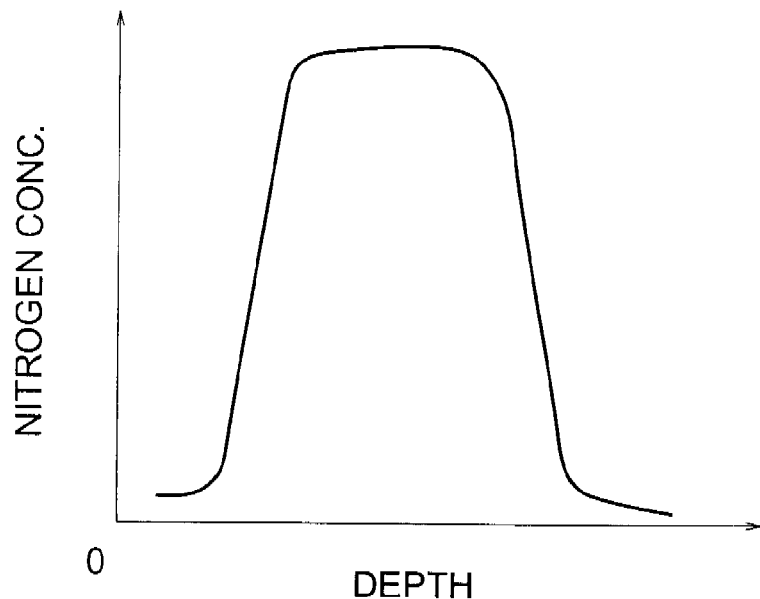
FIG. 9 is a graph showing the nitrogen concentration profile in the gate insulating film of the fourth example.

A semiconductor device of the fourth example was manufactured using a process according to the third embodiment. The process was such that the combination of steps S21 to S23 is conducted for a single cycle, followed by the step S25 for forming a SiO$_2$ film. The steps S21 and S23 included five unit steps of S11 and fifteen unit steps of S13, respectively, and the step S25 included five unit steps of S11. FIG. 9 shows, similarly to FIG. 4, the nitrogen concentration profile in the gate insulating film of the fourth example. The nitrogen concentration is higher in the central region of the gate insulating film in the thickness direction, and lower in the vicinity of both the interfaces with the gate electrode and silicon substrate.

FIRST COMPARATIVE EXAMPLE

Figure 10:
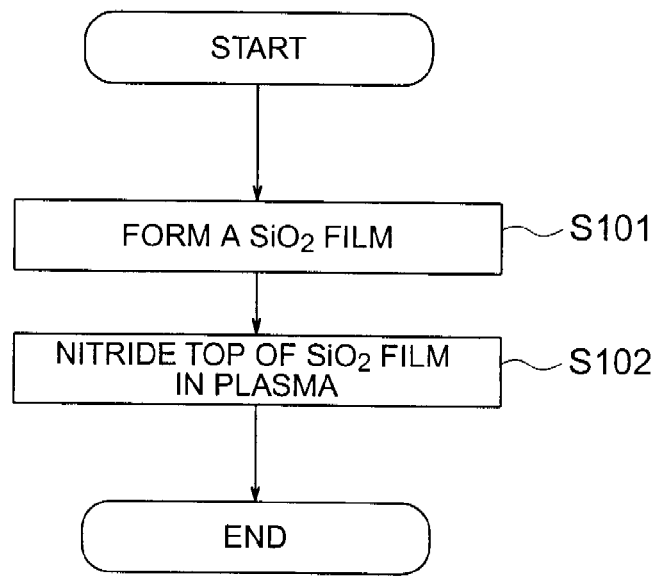
FIG. 10 is a flowchart showing the procedure of forming the gate insulating film in a process of a first comparative example.

FIG. 10 shows the procedure of manufacturing a semiconductor device in a process of the first comparative example. The process of the first comparative example is such that a SiO$_2$ film is deposited using a CVD technique on the silicon substrate up to a thickness of 10 nm (step S101), followed by a plasma-enhanced nitriding process for nitriding the deposited SiO$_2$ film to form a gate insulating film 12 (step S102).

Figure 11:
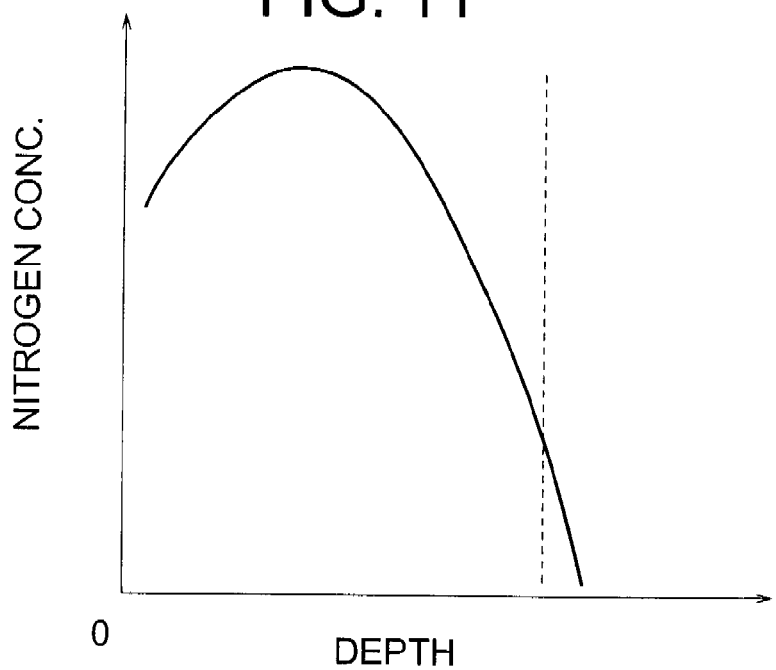
FIG. 11 is a graph showing the nitrogen concentration profile in the gate insulating film manufactured by the process of the first comparative example.

FIG. 11 shows the nitrogen concentration profile in the gate insulating film 12 in a semiconductor device manufactured by the process of the first comparative example. The nitrogen concentration was higher at the location below the interface with the gate electrode than at the interface with the gate electrode. In addition, the nitrogen introduced from the top surface of the gate insulating film reached and passed through the interface with the silicon substrate (shown by a dotted line), whereby the nitrogen concentration is not reduced in the vicinity of the latter interface to a desired level.

Figure 12:
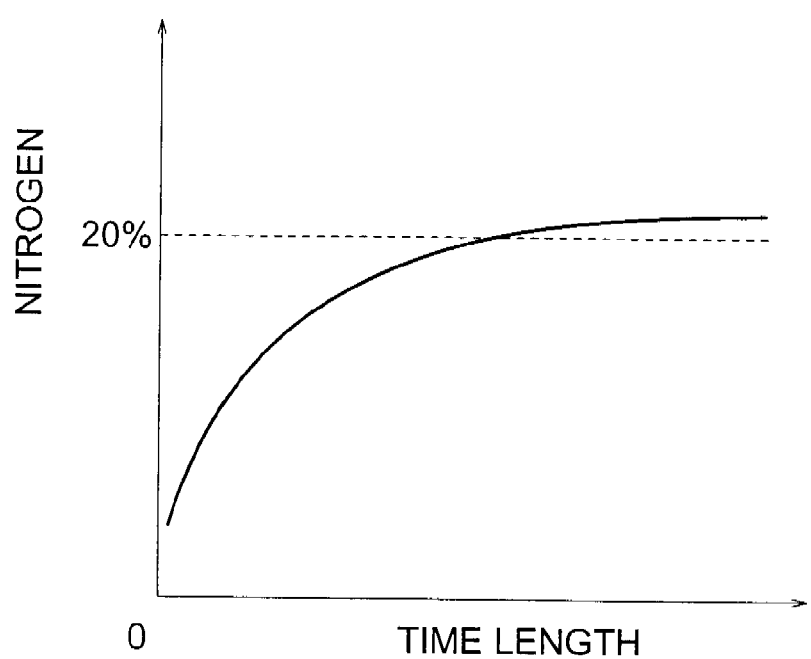
FIG. 12 is a graph showing the relationship between the nitrogen concentration in the top portion of the gate insulating film and the time length of nitriding treatment in the step S102 of FIG. 10.

FIG. 12 is a graph showing the relationship between the nitrogen concentration in the vicinity of the top surface of the gate insulating film 12 and the nitriding time length in step S102 in the flowchart of FIG. 10. Although the nitrogen concentration in the vicinity of the top surface of the gate insulating film 12 increased with the elapsed time length for the nitriding, the increase eventually saturated at the vicinity of a nitrogen concentration of about 20%. Thus, the process of the first comparative example is difficult to provide a nitrogen concentration higher than about 25%, and thus unable to provide a nitrogen concentration corresponding to the stoichiometric composition of Si$_3$N$_4$.

SECOND COMPARATIVE EXAMPLE

Figure 13:
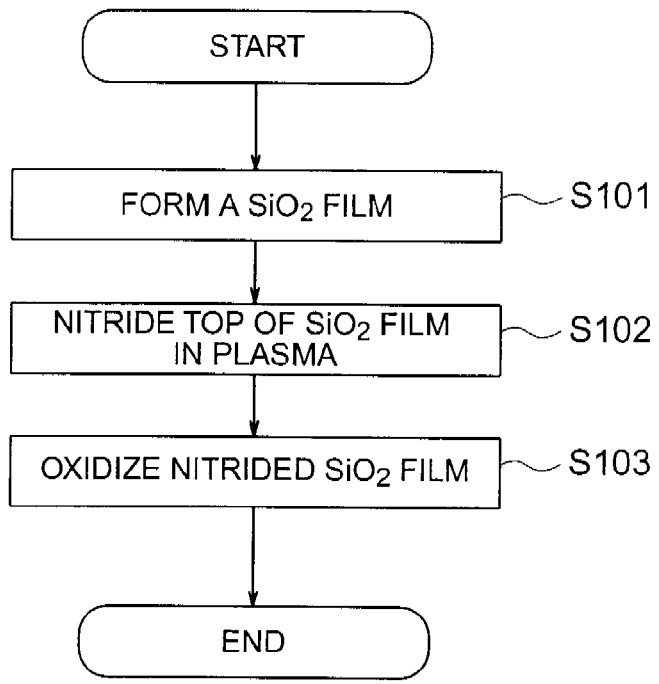
FIG. 13 is a flowchart showing the procedure of forming the gate insulating film in a process of a second comparative example.

FIG. 13 is shows the procedure of manufacturing a semiconductor device in a process of the second comparative example. The process of the second comparative example is such that a step S103 for oxidizing the silicon nitride film obtained in step S102 in FIG. 10 is added to the process of the first comparative example. The step S103 is conducted for the purpose of reducing the impurity level of the gate insulating film in the vicinity of the interface with the silicon substrate.

Figure 14:
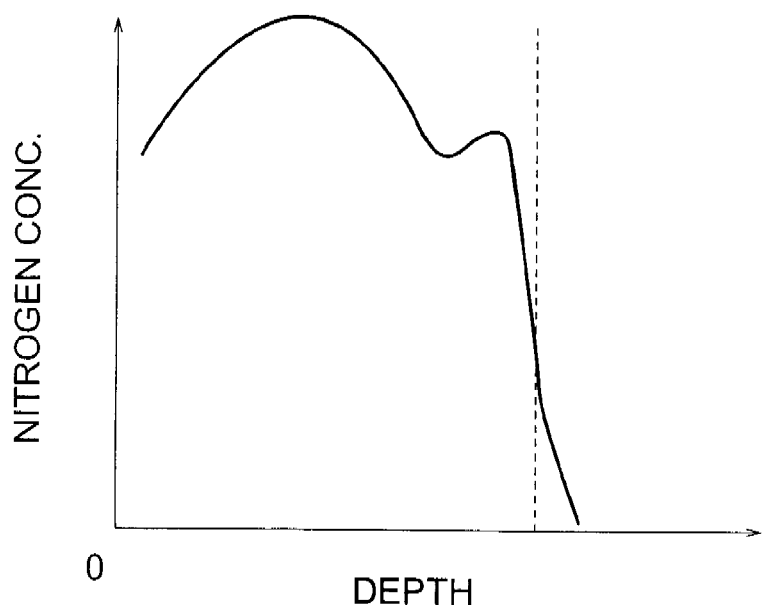
FIG. 14 is a graph showing the nitrogen concentration profile in the gate insulating film manufactured by the process of the second comparative example.

FIG. 14 shows the nitrogen concentration profile in the gate insulating film 12 of the second comparative example. The nitrogen concentration was higher in the vicinity of the interface with the silicon substrate compared to the first comparative example. This means the nitrogen in the gate insulating film was diffused toward the interface with the silicon substrate by the heat in the oxidation treatment. It is concluded here that although the oxidation reduced the impurity level of the gate insulating film in the second comparative example, the reduction of the impurity level was cancelled by the increase of the impurity level caused by diffusion of the nitrogen, whereby the impurity level could not well suppressed in the vicinity of the interface with the silicon substrate.

As described heretofore, in the semiconductor device of the first and second comparative examples, the nitrogen concentration in the vicinity of the interface with the gate electrode 13 was not increased to a desired level. Thus, it was confirmed that the process of the first through third embodiments, wherein a plasma-enhanced nitriding treatment is conducted for the top portion of the $SiO_2$ film before forming the silicon nitride film by using an ALD technique, is superior to the process of the first and second comparative examples.

In the above embodiment, the ALD process provides a $SiO_2$ film having a higher film quality and a smaller film thickness while effectively suppressing diffusion of the nitrogen toward the interface with the silicon substrate.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A method of manufacturing a semiconductor device, comprising:
   forming a silicon oxide film over a semiconductor substrate;
   performing a nitriding treatment on the silicon oxide film at a substrate temperature lower than 500 degrees Celsius, a nitrogen-contained layer being thereby formed at a top portion of the silicon oxide film; and,
   forming a silicon nitride film on the nitrogen-contained layer by an atomic layer deposition process in which a first silicon layer is deposited, followed by nitriding the first silicon layer at a substrate temperature lower than 500 degrees Celsius.

2. The method as claimed in claim 1, wherein the first silicon layer is deposited at a substrate temperature of 450 to 500 degrees Celsius.

3. The method as claimed in claim 1, wherein the silicon oxide film is formed by an atomic layer deposition process in which a second silicon layer is deposited, followed by oxidizing the second silicon layer.

4. The method as claimed in claim 3, wherein each of the first and second silicon layers is deposited at a substrate temperature of 450 to 500 degrees Celsius.

5. The method as claimed in claim 4, wherein the second silicon layer is oxidized at a substrate temperature of 450 to 500 degrees Celsius.

6. A method of manufacturing a semiconductor device, comprising:
   performing a first atomic layer deposition a first number of times to form a silicon oxide film over a semiconductor substrate, each first atomic layer deposition including deposition of a first silicon layer and then oxidizing the first silicon layer, the silicon oxide film thereby comprising a plurality of silicon oxide layers stacked with each other;
   performing a nitriding treatment on the silicon oxide film to form a nitrogen-contained layer at a top portion of the silicon oxide film; and
   forming a second atomic layer deposition a second number of times to form a silicon nitride film on the nitrogen-containing layer, each second atomic layer deposition including depositing a second silicon layer and then nitriding the second silicon layer, the silicon nitride film thereby comprising a plurality of silicon nitride layers stacked with each other, the first number of times being smaller than the second number of times.

7. The method as claimed in claim 6, wherein the nitriding treatment on the silicon oxide film is performed at a substrate temperature lower than 500 degrees Celsius and the nitriding of the second silicon layer in each second atomic layer deposition is performed at a substrate temperature lower than 500 degrees Celsius.

8. A method of manufacturing a semiconductor device, comprising:
   forming a silicon oxide film over a semiconductor substrate by a first atomic layer deposition;
   performing a nitriding treatment on the silicon oxide film to form a nitrogen-contained layer at a top portion of the silicon oxide film;
   forming a silicon nitride film on the nitrogen-containing layer by a second atomic layer deposition; and
   repeating, a plurality of times, a cycle comprising the forming of the silicon oxide film, then performing the nitriding treatment and the forming of the silicon nitride film.

9. The method as claimed in claim 8, wherein the first atomic layer deposition is carried out a plurality of times so that the silicon oxide film includes a plurality of silicon oxide films stacked with each other, the number of times for carrying out the first atomic layer deposition being larger than the number of times for carrying out the second atomic layer deposition.

10. The method as claimed in claim in 9, wherein the number of times for carrying out the first atomic layer deposition are decreased by one each time when the cycle is repeated.

11. The method as claimed in claim 8, wherein in a final cycle in repeating the cycle the plurality of times, the second atomic layer deposition is carried out a plurality of times, wherein each of the plurality of times is larger then the time for carrying the first atomic layer deposition.

12. The method as claimed in claim 8, further comprising forming a silicon oxide film with a third atomic layer deposition after repeating the cycle the plurality of times.

13. The method as claimed in claim 8, wherein the nitriding treatment on the silicon oxide film is performed at a substrate temperature lower than 500 degrees Celsius and the nitriding of the second silicon layer in each second atomic layer deposition is performed at a substrate temperature lower than 500 degrees Celsius.

* * * * *